(12) United States Patent
Kang et al.

(10) Patent No.: US 6,483,738 B2
(45) Date of Patent: Nov. 19, 2002

(54) METHOD FOR DRIVING NONVOLATILE FERROELECTRIC MEMORY DEVICE

(75) Inventors: Hee Bok Kang, Taejon-shi (KR); Hun Woo Kye, Kyoungki-do (KR); Je Hoon Park, Kyoungki-do (KR); Duck Ju Kim, Cheju-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 09/987,739

(22) Filed: Nov. 15, 2001

(65) Prior Publication Data

US 2002/0057590 A1 May 16, 2002

(30) Foreign Application Priority Data

Nov. 16, 2000 (KR) .............................................. 00-68113

(51) Int. Cl.$^7$ .............................................. G11C 11/22
(52) U.S. Cl. ........................ 365/145; 365/200; 365/210
(58) Field of Search ................................ 365/145, 210, 365/200, 189.01, 117, 203, 65, 139

(56) References Cited

U.S. PATENT DOCUMENTS

| 4,873,664 | A |   | 10/1989 | Eaton, Jr. .................... 365/145 |
|---|---|---|---|---|
| 5,424,975 | A |   | 6/1995 | Lowrey et al. ............. 365/145 |
| 5,432,731 | A |   | 7/1995 | Kirsch et al. ............... 365/145 |
| 5,541,872 | A |   | 7/1996 | Lowrey et al. ............. 365/145 |
| 5,638,318 | A |   | 6/1997 | Seyyedy ..................... 365/145 |
| 5,680,344 | A |   | 10/1997 | Seyyedy ..................... 365/145 |
| 5,682,344 | A |   | 10/1997 | Seyyedy ..................... 365/145 |
| 5,999,439 | A | * | 12/1999 | Seyyedy ..................... 365/145 |
| 6,055,200 | A | * | 4/2000 | Choi et al. ................... 365/145 |
| 6,091,622 | A | * | 7/2000 | Kang .......................... 365/145 |
| 6,278,630 | B1 | * | 8/2001 | Yamada ....................... 365/145 |
| 6,333,870 | B1 | * | 12/2001 | Kang .......................... 365/117 |

* cited by examiner

Primary Examiner—David Nelms
Assistant Examiner—Thong Le
(74) Attorney, Agent, or Firm—Morgan Lewis & Bockius LLP

(57) ABSTRACT

A method for driving a nonvolatile ferroelectric memory device enabling an operation of a writing mode and a reading mode of a data to be carried out equally in an entire cell array and being suitable for reducing cell size by decreasing a minimum sensing voltage is disclosed. This method for driving a nonvolatile ferroelectric memory device, which includes a main cell and a reference cell provided with one transistor and one or more ferroelectric capacitors among a first voltage applying line (wordline), a bitline and a second voltage applying line, the method including the steps of primarily activating the wordline and a reference wordline at high level in an active period of one cycle, deactivating the wordline and the reference wordline, activating a sensing amplifier after the wordline is inactivated, secondarily activating the wordline at high level in a state that the sensing amplifier is activated in the active period, applying high level of at least one time or more to the second voltage applying line to be coincident with the secondary active period of the wordline at at least one point, and transiting a chip enable signal from low to high level to precharge the chip enable signal.

14 Claims, 12 Drawing Sheets

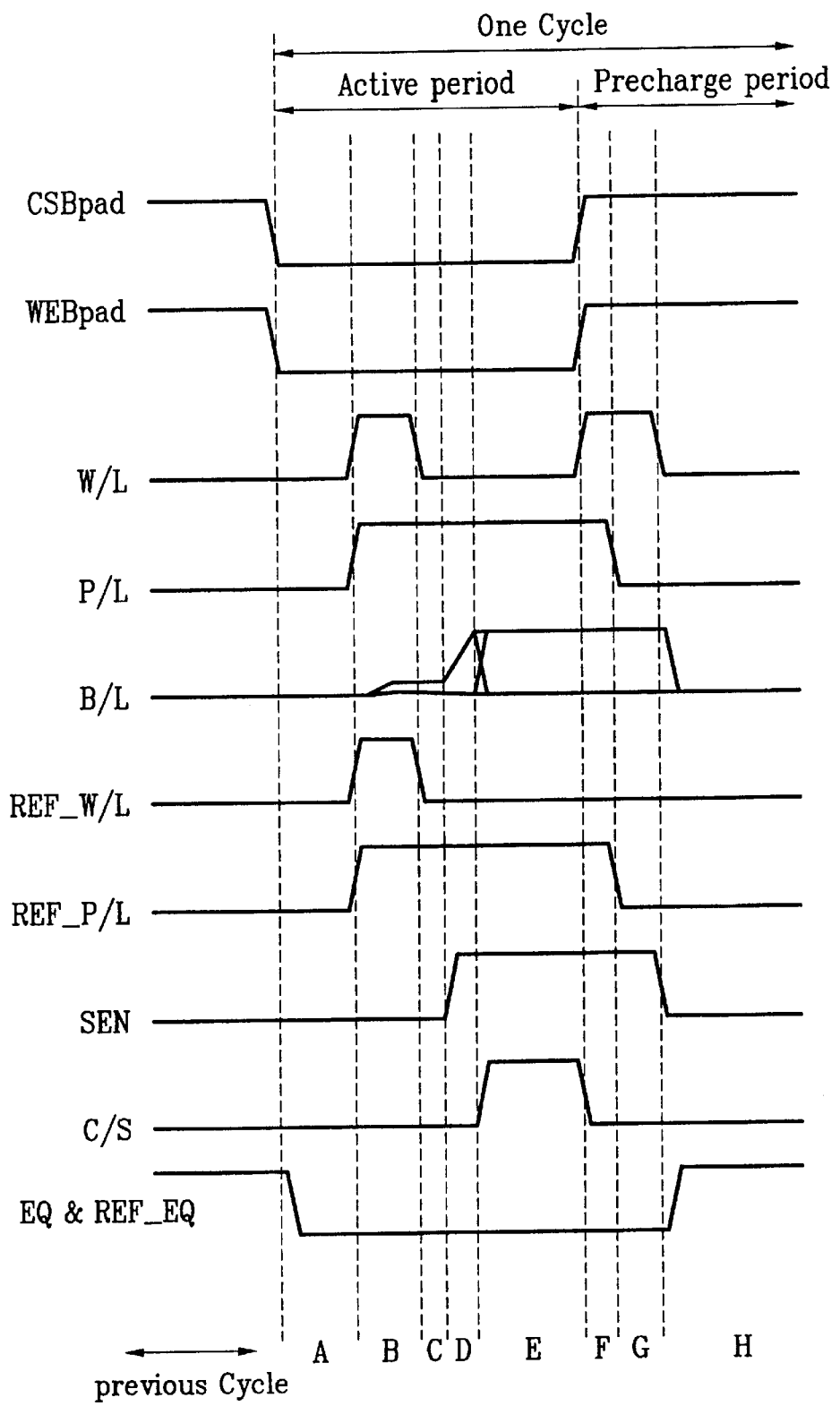

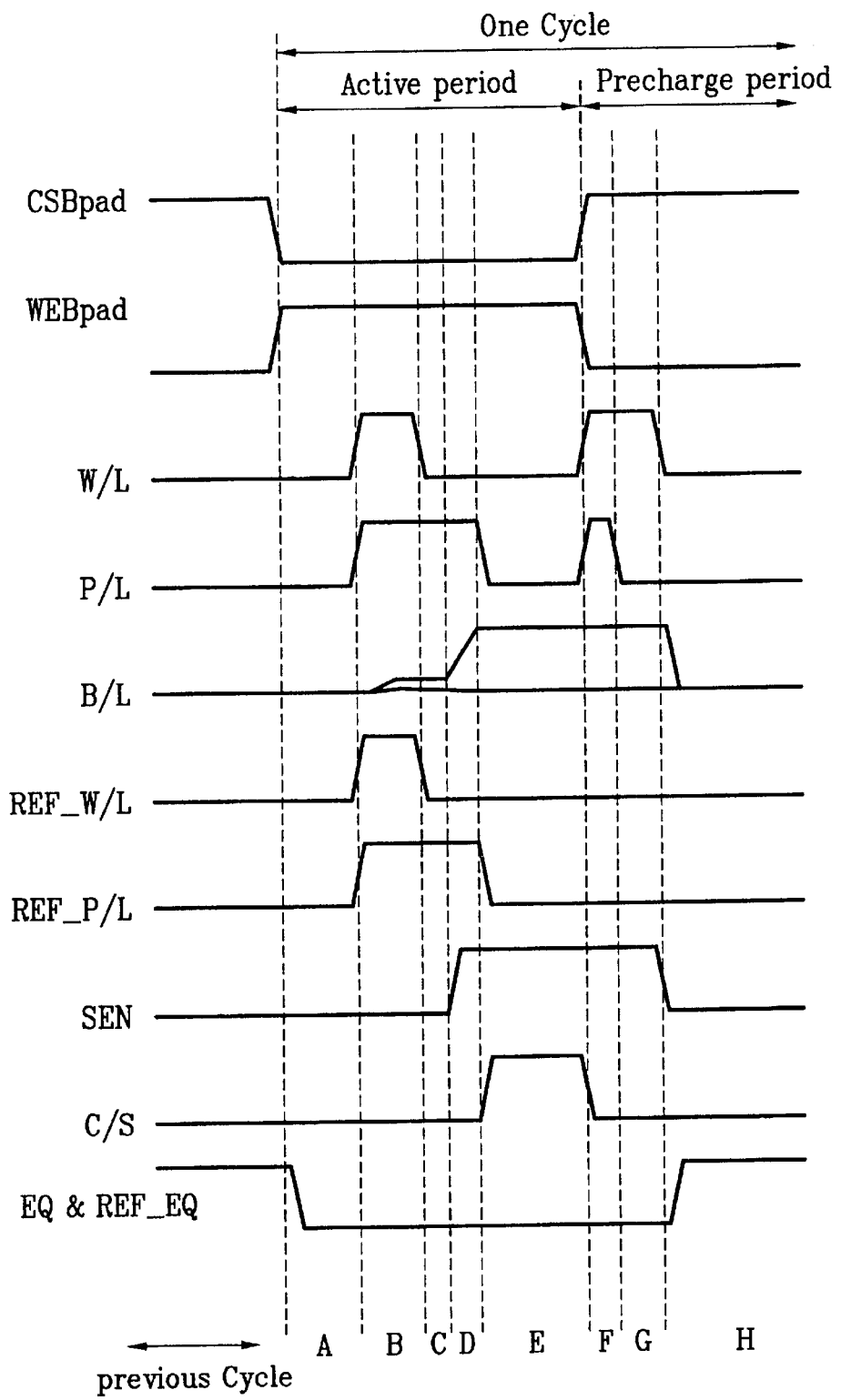

METHOD FOR DRIVING NONVOLATILE FERROELECTRIC MEMORY DEVICE

This application claims benefit of Korean Patent Application No. P2000-68113, filed on Nov. 16, 2000, which is hereby incorporated by reference.

BACKGROUND OF THE INVENTION

1. Field of the Invention

The present invention relates to a semiconductor memory device, and more particularly, to a method for driving a nonvolatile ferroelectric memory device.

2. Background of the Related Art

Generally, a nonvolatile ferroelectric memory device, i.e. ferroelectric random access memory (FRAM), has a data processing speed equal to a dynamic random access memory (DRAM) and retains data even in power off. For this characteristic, the nonvolatile ferroelectric memory has been highly regarded as a next generation memory device.

As a memory device having structures similar to those of a DRAM, FRAM uses high residual polarization, which is a characteristic of ferroelectric material, by using ferroelectric material as a component of a capacitor.

Due to such characteristic of residual polarization, data remains unerased even if the electric field is removed.

FIG. 1 illustrates a hysteresis loop of a general ferroelectric.

As shown in FIG. 1, even if polarization induced by the electric field has the electric field removed, data is maintained at a certain amount (i.e., "d" and "a" states) without being erased due to the presence of residual polarization (or spontaneous polarization).

A nonvolatile ferroelectric memory cell is used as a memory device by corresponding the "d" and "a" states to 1 and 0, respectively.

FIG. 2 illustrates a unit cell of a nonvolatile ferroelectric memory device of the related art.

As shown in FIG. 2, the nonvolatile ferroelectric memory device of the related art includes a bitline B/L formed in one direction, a wordline W/L formed to cross the bitline, a plate line P/L spaced apart at equal intervals from the wordline in the same direction as the wordline, a transistor T1 with a gate connected to the wordline and a source connected with the bitline, and a ferroelectric capacitor FC1, whereof a first terminal is connected with a drain of a transistor T1 and a second terminal is connected with a plate line P/L.

The data input/output operation of such ferroelectric memory device is described as follows.

FIG. 3A is a timing chart illustrating the operation of the writing mode of the related art nonvolatile ferroelectric memory device, and FIG. 3B is a timing chart illustrating the operation of the reading mode thereof.

During the writing mode, an externally applied chip enable signal CSBpad is activated from high state to low state. At the same time, the writing mode starts if a write enable signal is applied from high state to low state.

Subsequently, if address decoding in the writing mode starts, a pulse applied to a corresponding wordline is transited from low state to high state to select a cell.

A high signal in a certain period and a low signal in a certain period are sequentially applied to a corresponding plate line in a period where the wordline is maintained at high state. To write a logic value "1" or "0" in the selected cell, a high signal or low signal synchronized with the write enable signal WFBpad is applied to a corresponding bitline.

In other words, a high signal is applied to the bitline, and if the low signal is applied to the plate line in a period where the signal applied to the wordline is high, a logic value "1" is written on the ferroelectric capacitor. A low signal is applied to the bitline, and if the signal applied to the plate line is high, a logic value "0" is written in the ferroelectric capacitor.

The reading operation of data stored in a cell is described as follows.

If an externally applied chip enable signal CSBpad is activated from high state to low state, all of the bitlines become equipotential to low voltage by an equalizer signal before a corresponding wordline is selected.

Then, the respective bitline becomes inactive and an address is decoded. The low signal is transited to the high signal in the corresponding wordline according to the decoded address enabling a corresponding cell to be selected.

The high signal is applied to the plate line of the selected cell to destroy data Qs corresponding to the logic value "1" stored in the ferroelectric memory.

If the logic value "0" is stored in the ferroelectric memory, the corresponding data Qs is not destroyed. The destroyed data and the data that is not destroyed are output as different values by the ferroelectric hysteresis loop, so that a sensing amplifier senses the logic value "1" or "0".

In other words, as shown in the hysteresis loop of FIG. 1, if the data is destroyed, the "d" state is transited on to an "f" state. If the data is not destroyed, the "a" state is transited to the "f" state. Thus, if the sensing amplifier is enabled after a set time has elapsed, the logic value "1" is output in case the data is destroyed, while the logic value "0" is output in case the data is not destroyed.

As described above, after the sensing amplifier amplifies data, the plate line becomes inactive from a high state to a low state at the state whereby the high signal is applied to the corresponding wordline to recover the data from the original data.

The aforementioned method for driving a nonvolatile memory device of the related art encounters the following problems.

In case of the operation of the writing mode and the reading mode of data, the wordline should be activated from an active period of an operation cycle (1 cycle) to a pre-charge period. Thus, it is difficult to control the amount of charge released from a cell, and accordingly, it is difficult to read or write the data equally from the entire cell array.

In addition, the sensing amplifier is activated when the wordline is activated to a high state. This results in a difference between the capacitance of a main cell bitline and the capacitance of a reference cell bitline, and accordingly, there is a limitation in reducing the cell size by decreasing the sensing voltage.

SUMMARY OF THE INVENTION

Accordingly, the present invention is directed to a method for driving a nonvolatile ferroelectric memory device that substantially obviates one or more problems due to limitations and disadvantages of the related art.

An object of the present invention is to provide a method for driving a nonvolatile ferroelectric memory device that enables the operation of the writing mode and the reading mode of data to be carried out equally in the entire cell array, without depending on its position. This is due to a controlled operation of a first wordline pulse width, which controls the amount of charge released from the cell.

Another object of the present invention is to provide a method for driving a nonvolatile ferroelectric memory device that suitable for reducing the cell size by decreasing the minimum sensing voltage. This is due to the equalized RC loading conditions of a main bitline and a reference bitline in view of the sensing amplifier, which is possible by activating the sensing amplifier after making the first wordline pulse inactive.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a method for driving a non-volatile ferroelectric memory device includes a main cell and a reference cell provided with one transistor and one or more ferroelectric capacitors among a first voltage applying line (wordline), a bitline and a second voltage applying line, the method comprising the steps of primarily activating the wordline and a reference wordline at high level in an active period of one cycle, deactivating the wordline and the reference wordline, activating a sensing amplifier after the wordline is inactivated, secondarily activating the wordline at high level in a state that the sensing amplifier is activated in the active period, applying high level of at least one time or more to the second voltage applying line to be coincident with the secondary active period of the wordline at at least one point, and transiting a chip enable signal from low level to high level to precharge the chip enable signal.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings:

FIG. 9A is an exemplary timing chart showing the operation of a write mode according to the first embodiment of the present invention;

FIG. 10B is an exemplary timing chart showing the operation of a read mode according to the second embodiment of the present invention;

DETAILED DESCRIPTION OF THE INVENTION

Reference will now be made in detail to the preferred embodiments of the present invention, examples of which are illustrated in the accompanying drawings.

Figure 4:
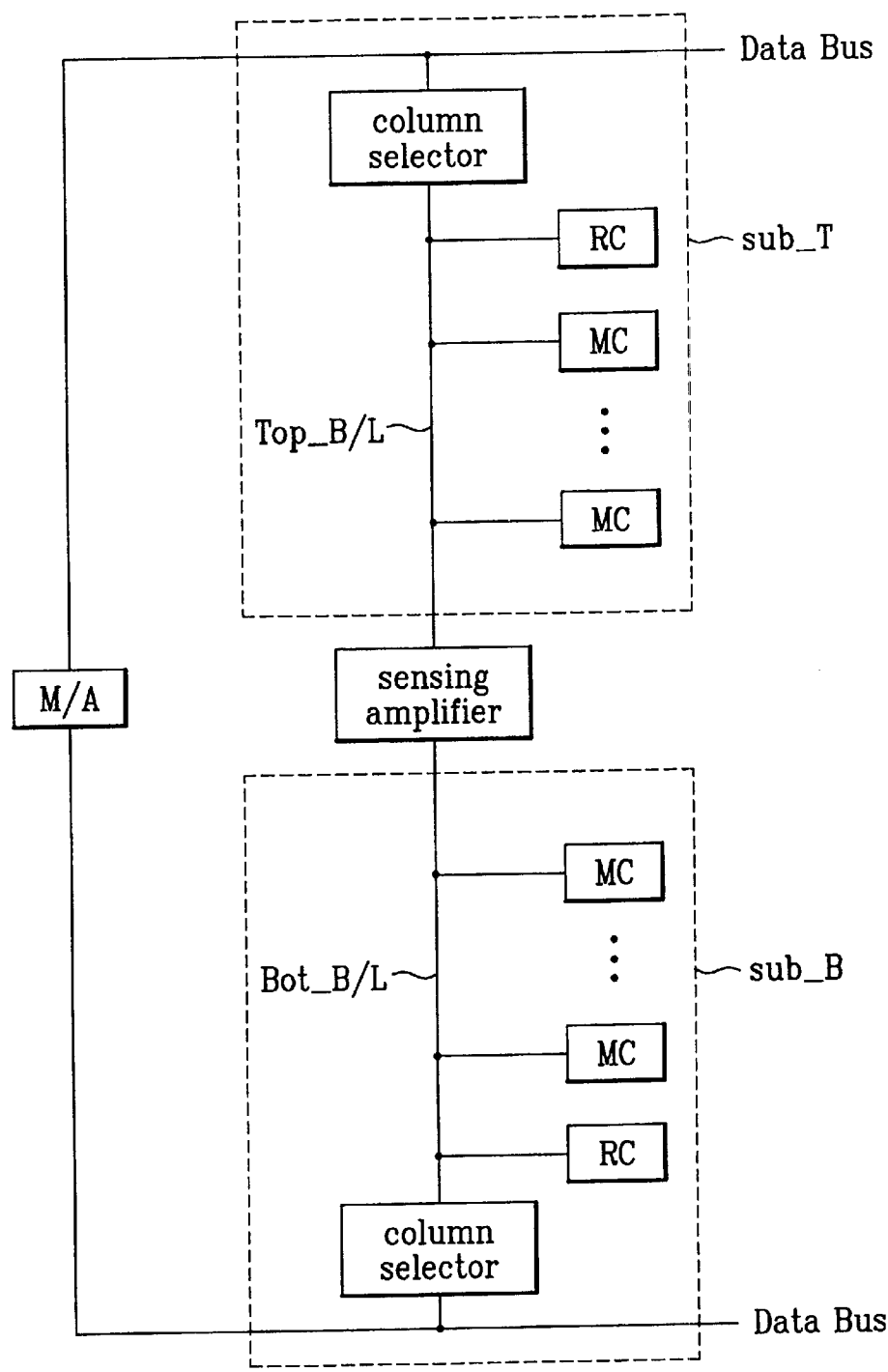
FIG. 4 is a schematic view of a cell array block of an exemplary nonvolatile ferroelectric memory device according to the first embodiment of the present invention.
Figure 5:
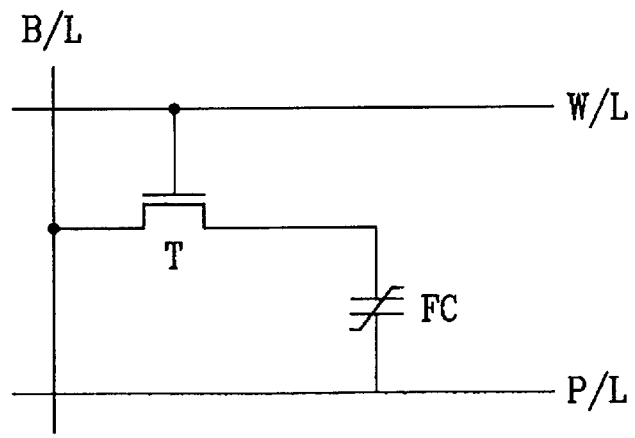
FIG. 5 is a schematic view of an exemplary main cell of FIG. 4.

FIG. 4 is a schematic view of an exemplary cell array block of a nonvolatile ferroelectric memory device according to the first embodiment of the present invention, and FIG. 5 is a main schematic view of a main cell of FIG. 4.

A cell array block includes a plurality of sub cell arrays. A sensing amplifier S/A is formed between adjacent top and bottom sub cell arrays sub_T and sub_B.

Each of the sub cell arrays includes bitlines Top_B/L and Bot_B/L, a plurality of main cells MC connected to the bitlines Top_B/L and Bot_B/L, a reference cell RC connected to the bitlines Top_B/L and Bot_B/L, and a column selector CS.

At this time, the reference cell RC within the sub cell array sub_T formed in a top portion of the sensing amplifier S/A is simultaneously accessed when the main cell M/C within the sub cell array sub_B is accessed.

On the other hand, the reference cell RC within the sub cell array sub_B formed in a bottom portion of the sensing amplifier S/A is simultaneously accessed when the main cell MC within the sub cell array sub_T is accessed.

The column selector CS selectively activates a corresponding column bitline using Y(column) address.

If the column selector CS is in high level, the corresponding column bitline is connected to a data bus, so as to enable data transmission.

Figure 2:
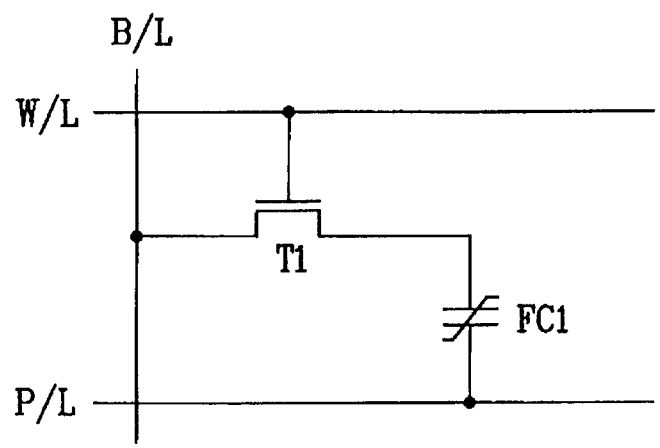
FIG. 2 is a schematic view of a unit cell of a related art nonvolatile ferroelectric memory device.
Figure 3A:
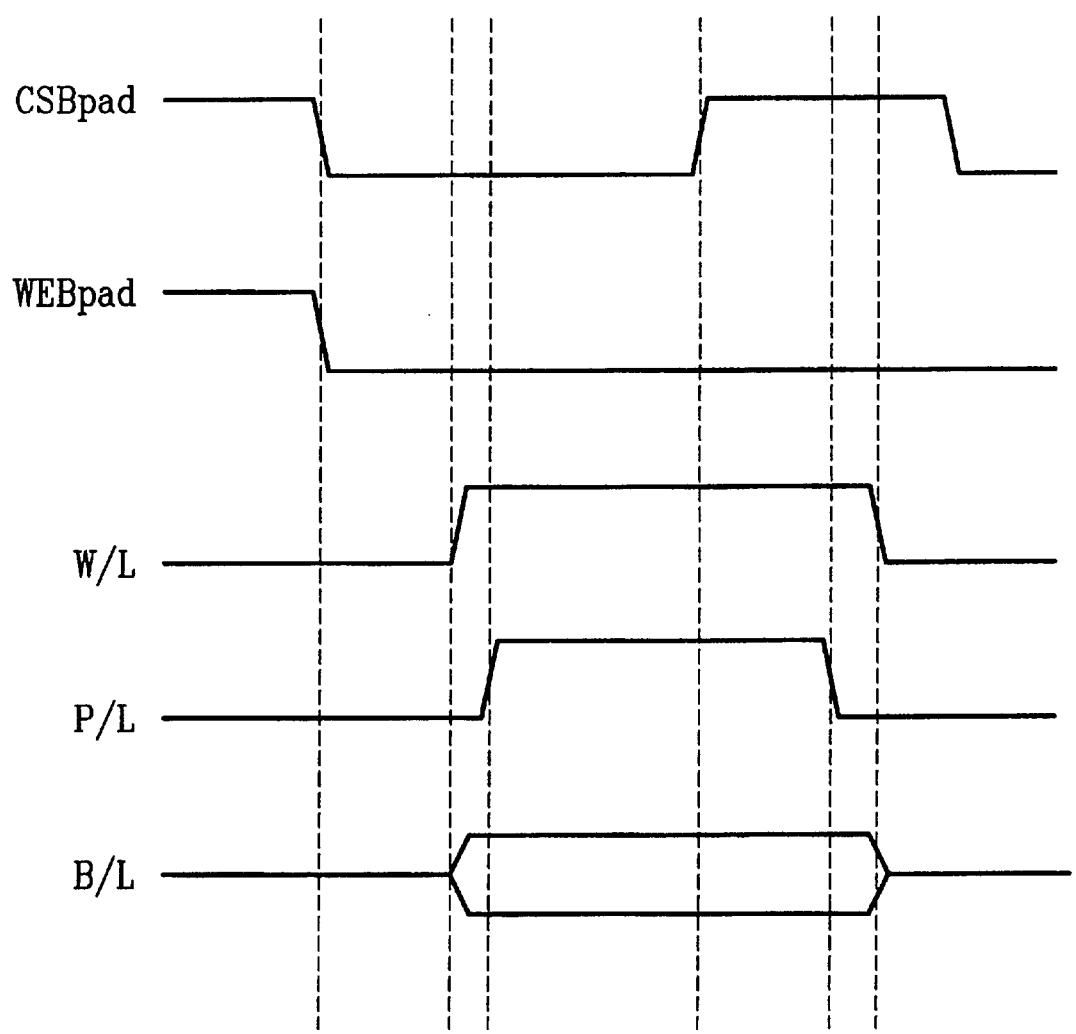
FIG. 3A is a timing chart illustrating the operation of a write mode of the related art nonvolatile ferroelectric memory device.
Figure 3B:
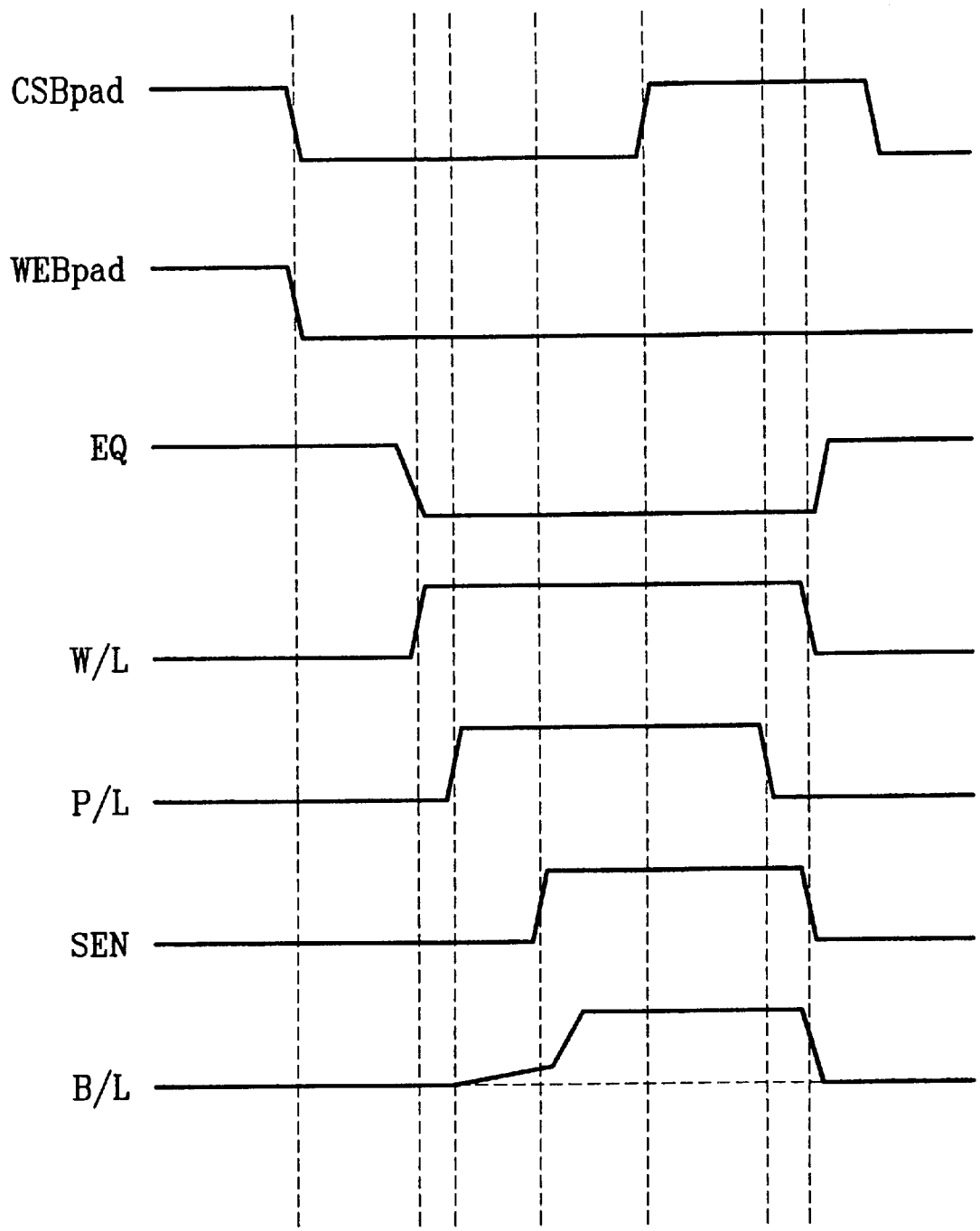
FIG. 3B is a timing chart illustrating the operation of a read mode of the related art nonvolatile ferroelectric memory device.

The main cell MC is constructed as shown in FIG. 5, in the same manner as the main cell shown in FIG. 2. That is, as shown in FIG. 5, a bitline B/T is formed in one direction, and a wordline W/L is formed to cross the bitline. A plate line P/L is spaced apart from the wordline W/L in the same direction as the wordline W/L. A transistor T with a gate connected with the wordline W/L and a source connected with the bitline B/L is formed. A ferroelectric capacitor FC is formed in such a manner that its first terminal is connected with a drain of the transistor T and its second terminal is connected with the plate line P/L.

Figure 6:
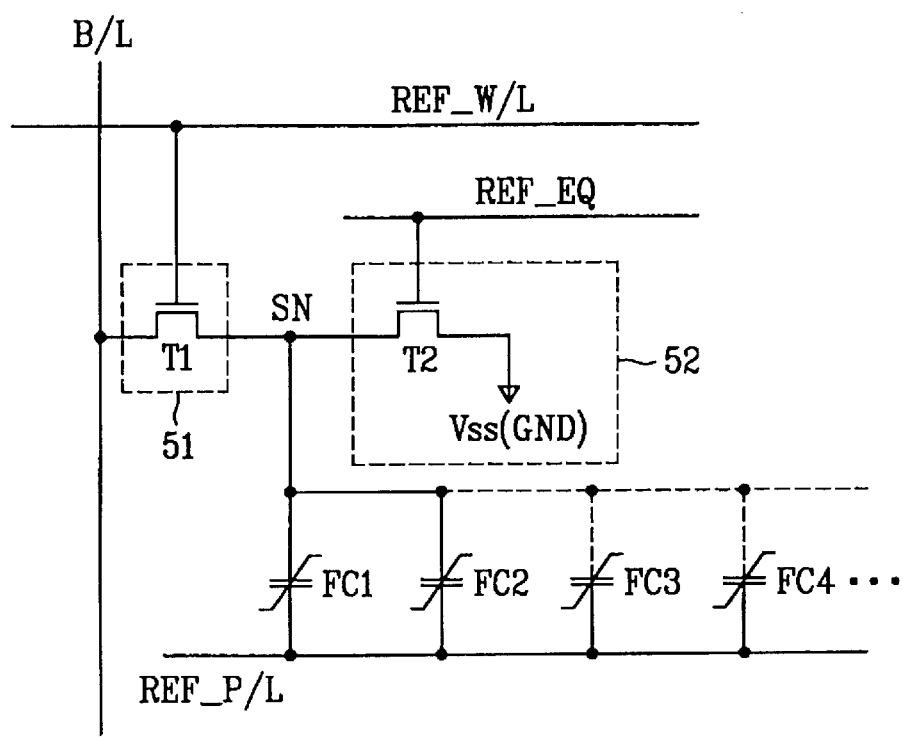
FIG. 6 is a schematic view of an exemplary reference cell of FIG. 4.

Each of the reference cells is constructed as shown in FIG. 6.

FIG. 6 is a detailed schematic view of a reference cell shown in FIG. 4.

As shown in FIG. 6, the reference cell of the nonvolatile ferroelectric memory device includes a bitline B/L formed in one direction, a reference wordline REF_W/L formed across the bitline, and a switch block 51 is controlled by a signal of the reference wordline to selectively transmit a reference voltage stored in the ferroelectric capacitors to the bitline B/L. The level initiating block 52 selectively initiates a level of the input terminal of the switching block 51 connected to the ferroelectric capacitors. The ferroelectric capacitors are connected to the input terminal of the switching block 51 in parallel.

The switching block 51 includes an NMOS transistor (hereinafter, "first transistor") T1 with a gate connected to the reference wordline REF_W/L, a drain connected to the bitline B/L, and a source connected to a storage node SN.

The level initiating block is controlled by a reference cell equalizer control signal REF_EQ which is a control signal for initiating the storage node SN of the reference cell. Also, the level initiating block 52 includes an NMOS transistor (hereinafter, "second transistor") T2 connected between the source of the first transistor T1 and a ground terminal Vss.

The number of ferroelectric capacitors FC1, FC2, FC3, FC4, . . . , and FCn is determined depending on the capacitor size of the reference cell.

The storage node SN is connected with first terminals of the ferroelectric capacitors FC1, FC2, FC3, FC4, . . . , and FCn in parallel.

The reference cell equalizer control signal REF_EQ initiates the storage node to a ground voltage level. Namely, if the reference cell equalizer control signal REF_EQ is in high level, the second transistor T2 is turned on so that the storage node is maintained at a ground voltage level.

The operation of the aforementioned reference cell will now be described.

Figure 1:
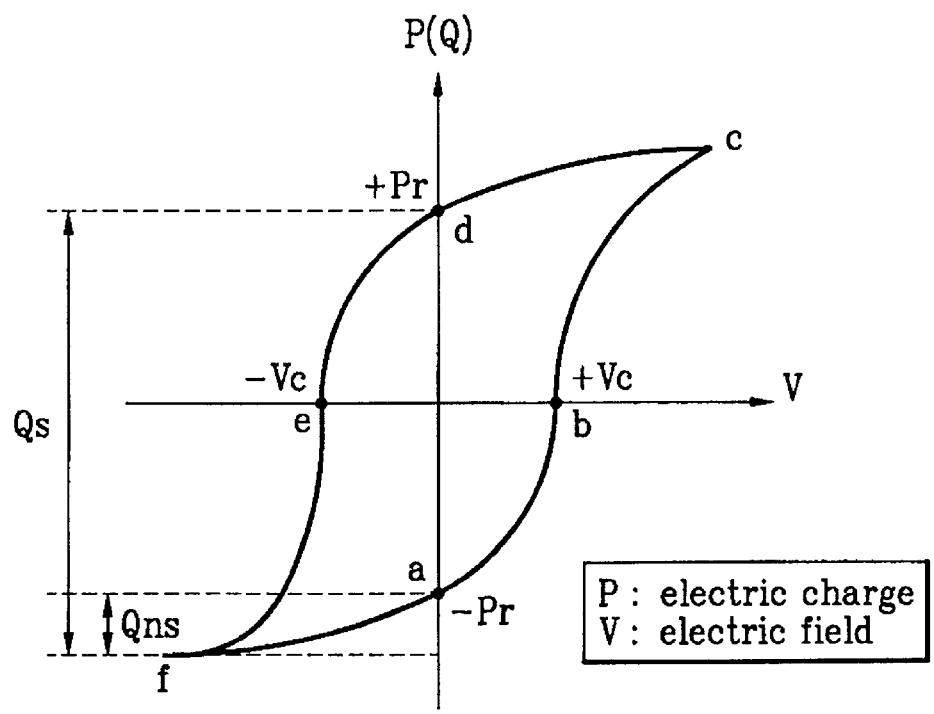
FIG. 1 shows a hysteresis loop of a general ferroelectric.

Qs and Qns of hysteresis loop in FIG. 1 denote switching charges of the ferroelectric capacitor and non-switching charges of the ferroelectric capacitor, respectively. The reference cell of the present invention on based on Qns.

That is to say, the reference wordline REF_W/L within the operation cycle is transited to high level together with the reference plate line REF_P/L. Accordingly, charges equivalent to the size of Qns×ferroelectric capacitor are supplied to the bitline B/L.

At this time, the reference wordline REF_W/L is transited to low level before the sensing amplifier is operated, so that the reference cell is not affected by a voltage of the bitline.

Meanwhile, the reference plate line is maintained at high level, and is transited to low level when the reference wordline is sufficiently stabilized.

As described above, since non-switching charges Qns are used, a separate restoring operation is not required during a precharge period. Accordingly, high level is not required any longer in the reference wordline.

Since the reference level is affected by an initial level of the storage node, the second transistor T2 of FIG. 6 is used to stabilize the storage node, and the reference equalizer control signal REF_EQ is used to initiate the storage node to the ground voltage level. Therefore, since the initial level of the storage is maintained at the ground voltage level, the reference level can be stabilized.

The column selector will now be described with reference to FIG. 7.

Figure 7:
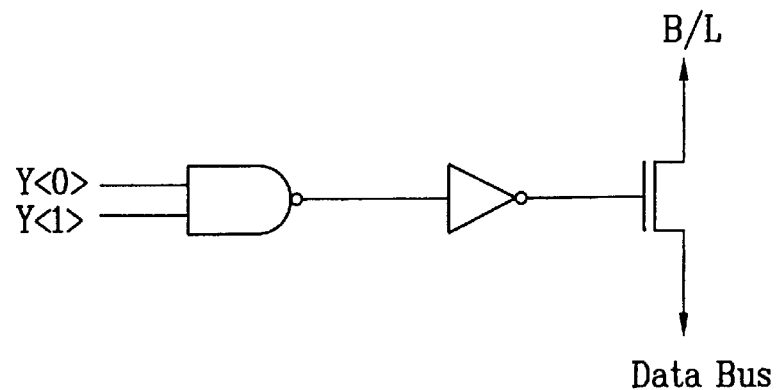
FIG. 7 is a circuit diagram of an exemplary column selector of FIG. 4.

As shown in FIG. 7, a column selector consists of a NAND gate, which performs a logic AND operation of column selection signals Y<0>and Y<1> and inverses the resultant value, and an inverter which inverses output signals of the NAND gate.

The NMOS transistor, which receives the output signals from the inverter of the column selector through the gate terminal and selectively activates the corresponding bitline, is positioned between the bitline and the data bus.

A drain terminal of the NMOS transistor is directly connected to the bitline of the cell array, and the source terminal is connected to the data bus.

Therefore, if the output of the column selector is activated to high, the bitline signal can be transmitted to the data bus.

The sensing amplifier S/A will be described below with reference to FIG. 8.

Figure 8:
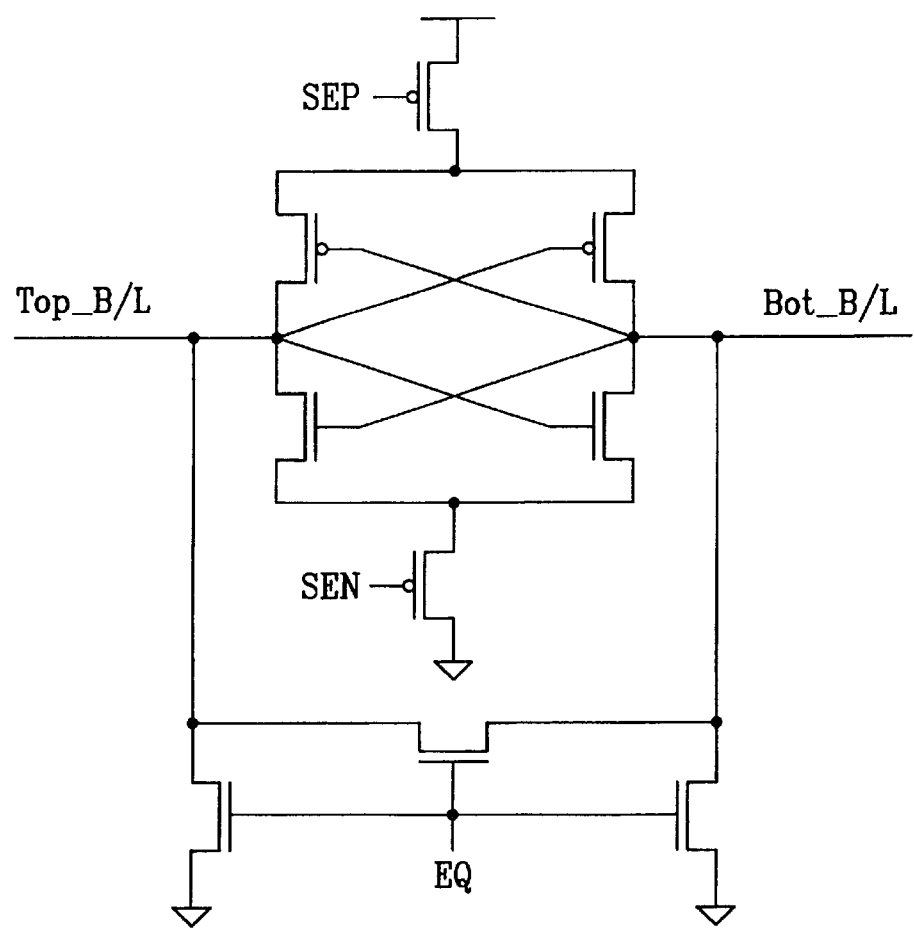
FIG. 8 is a schematic view of an exemplary sensing amplifier of FIG. 4.

As shown in FIG. 8, the sensing amplifier S/A includes first and second NMOS transistors which are operated by receiving SEP signal and SEN signal, and two latch type CMOS transistors (wherein, PMOS transistor and NMOS transistor are serially connected with each other) connected in parallel between the first and second NMOS transistors.

The bitlines Top_B/L and Bot_B/L are connected to output terminals of the respective CMOS transistors. An NMOS transistor is respectively formed between the bitlines Top_B/L and Bot_B/L and between the bitlines Top_B/L and Bot_B/L and the ground voltage. The NMOS transistor acts to equalize levels of the bitlines Top_B/L and Bot_B/L by receiving the EQ signal.

As described above, the sensing amplifier is latch type, and the bitlines Top_B/L and Bot_B/L are equalized at low level by the EQ signal.

The SEN signal is a sensing amplifier enable signal, and the SEP signal is a signal having a phase opposite to the SEN. When the data of the main cell and the reference cell are sufficiently transmitted to the bitlines, the SEN is activated at high level at the same time the SEP is activated at low level, so that the sensing operation starts.

The method for driving the aforementioned nonvolatile ferroelectric memory device according to the first embodiment of the present invention will now be described.

Figure 9B:
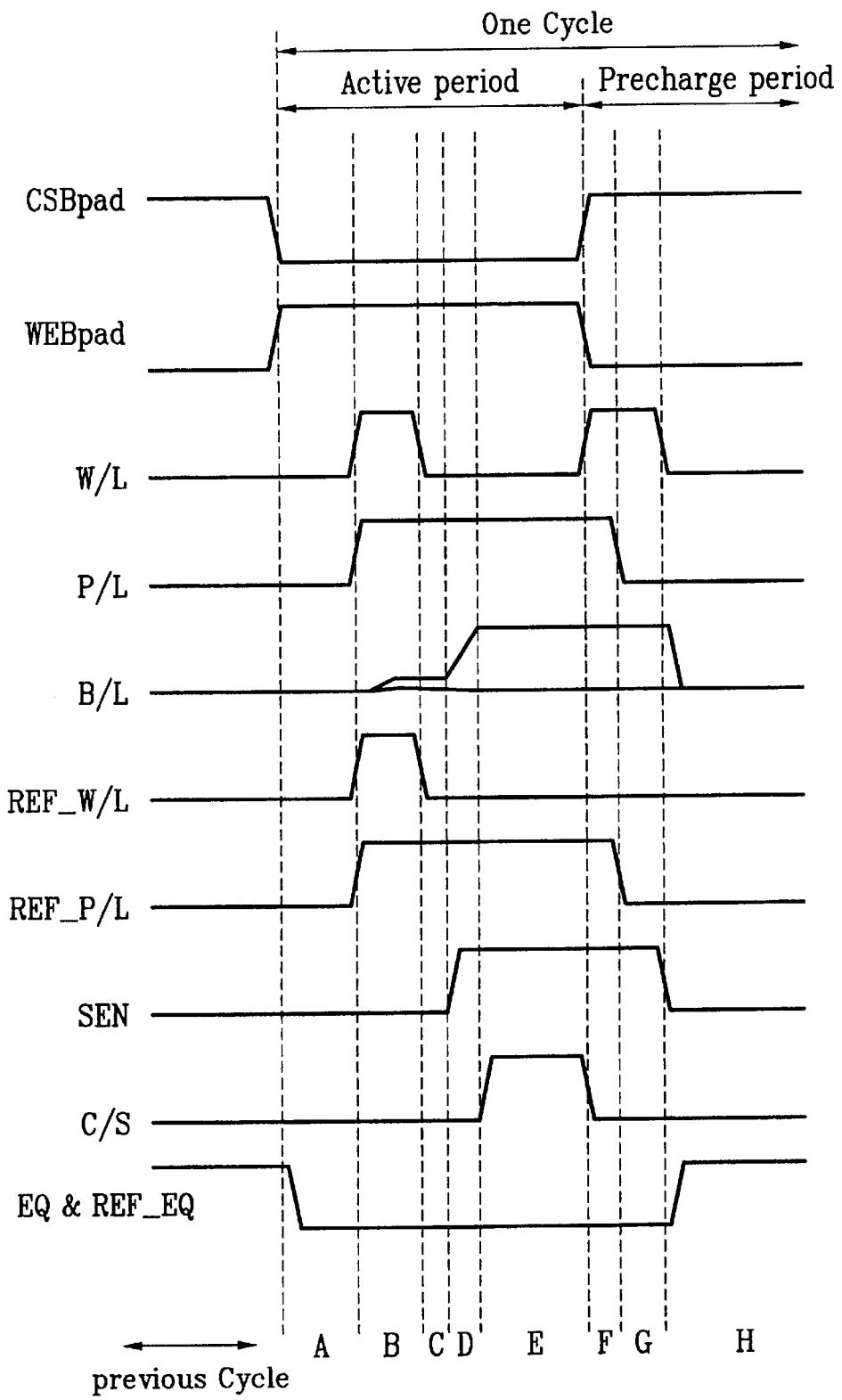
FIG. 9B is an exemplary timing chart showing the operation of a read mode according to the first embodiment of the present invention.

FIG. 9 is a timing chart showing the operation of a write mode according to the first embodiment of the present invention, which is applied to the nonvolatile ferroelectric memory device of FIG. 4, and FIG. 9B is a timing chart showing the operation of a read mode according to the first embodiment of the present invention, which is applied to the nonvolatile ferroelectric memory device of FIG. 4.

One cycle for writing and reading operations includes an active period and a precharge period. That is, one cycle is completed in such a manner that the chip enable signal CSBpad is transited to low level to start the active period and then the precharge period advances.

During the active period in one cycle, the wordline W/L is activated two times to high level and the plate line P/L is activated one time to high level. After the wordline is transited from high level to low level (i.e., after the wordline is inactivated), the sensing amplifier is activated, so that reading and writing operations of the memory cell can be performed.

The high level of the plate line entirely overlaps the first high level period of the wordline and partially overlaps the front portion of the second high level period of the wordline.

In the above operation, in the period where both the high level of the second wordline and the high level of the plate line both overlap to high level, logic value "0" is written. In the period where the second wordline is high level and the plate line is low level, logic value "1" is restored or written.

It is noted that operation waveforms of the write mode and the read mode are equal to each other in FIGS. 9A and 9B.

However, in FIG. 9A, external data is forcibly input to the bitline through a data input pad (Din pad) when the writing operation is performed by the write enable signal WEBpad. In FIG. 9B, data of the sensing amplifier is transmitted to external data input/output pad (Din/out pad).

With reference to waveforms of FIGS. 9A and 9B, the data writing and reading operations according to the first embodiment of the present invention will be described.

In the first embodiment of the present invention, the plate line is activated one time to high level when the wordline is activated twice to a high level.

As shown in FIGS. 9A and 9B, the external chip enable signal CSBpad is transited from high level to low level during period A, so that the active period of the chip starts. At the same time, the write enable signal WEBpad is in low level.

At this time, the reference wordline REF_W/L and the reference plate line REF_P/L are maintained at low level.

Subsequently, if address decoding starts, a corresponding wordline W/L, a corresponding plate line P/L, a corresponding reference wordline REF_W/L, and a corresponding reference plate line REF_P/L are activated to high levels during period B. Thus, the data of the main cell and the data of the reference cell are transmitted to their respective bitlines.

For reference, the bitline to which the data of the main cell is transmitted is not the same as the bitline to which the data of the reference cell is transmitted. Namely, as described above, among sub cell arrays, the main cell within the sub cell array at the top portion of the sensing amplifier is operated together with the reference cell within the sub cell array at the bottom portion of the sensing amplifier. Accordingly, the data of the main cell is transmitted to the bitline within the sub cell array at the top portion while the data of the reference cell is transmitted to the bitline within the sub cell array at the bottom portion.

When the data of the main cell and the data of the reference cell are sufficiently transmitted to their corresponding bitline, the wordline W/L and the reference wordline REF_W/L are transited to low level at the end of the period B so that the bitline B/L is separated from the cell.

Therefore, the bitline loading due to the difference of the capacitor size between the main cell and the reference cell can be removed. This improves sensing margin of the sensing amplifier.

The wordline W/L and the reference wordline REF_W/L are transited to low level during period C, and the active signal SEN of the sensing amplifier is activated to high level during period D. Thus, the data of the bitline is amplified.

The plate line P/L is maintained at high level during period B to period F showing the wordline from the first high level to the second high level, and then is transited to low level.

The reference plate line REF_P/L is driven in the same waveform as the plate line P/L.

Finally, when the first pulse of the wordline W/L and the reference wordline REF_W/L are transited from high level to low level, the plate line P/L and the reference plate line REF_P/L are not transited. Accordingly, interference noise that may occur due to simultaneous transition can be avoided.

Afterwards, if amplification operation of the sensing amplifier advances to a stable mode, the column selector C/S is activated to high level during period E, so that the data of the bitline B/L is exchanged with the data of the data bus. That is, the data of the data bus is forcibly transmitted to the bitline.

At the point where the chip enable signal CSBpad is transited to low level, the bitline equalizer signal EQ and the reference bitline equalizer signal REF_EQ are transited to low level, in periods A to G where the wordline is two times activated to high level.

Also, since the sensing amplifier is continuously activated when the second wordline is transited to high level during periods F and G of the precharge period, the bitline B/L continuously maintains the amplified data or reprogrammed data.

Accordingly, the data of the main cell having a logic value "1", destroyed during period B, is restored or written during period G.

Also during period F, in which the wordline W/L and the plate line P/L are in high level, the data of the main cell having a logic value "0", destroyed during period B is restored or written during period G.

The storage node of the bitline and the reference cell is initiated to the ground level during period H, and then is in standby state to start the next cycle.

The read mode shown in FIG. 9B is equal to the write mode in its waveforms. As described above, however, in the write mode, external data is forcibly input to the bitline through the data input pad (Din pad). In the read mode, the data of the sensing amplifier is transmitted to external data input/output pad (Din/out pad). (That is, the data of the sensing amplifier is transmitted to the data bus.)

Additionally, in the write mode the write enable signal WEBpad is in low level during the active period and in high level during the precharge period, and in the read mode the write enable signal is in high level during the active period and in low level during the precharge period.

The method for driving the aforementioned nonvolatile ferroelectric memory device according to the second embodiment of the present invention will now be explained.

Figure 10A:
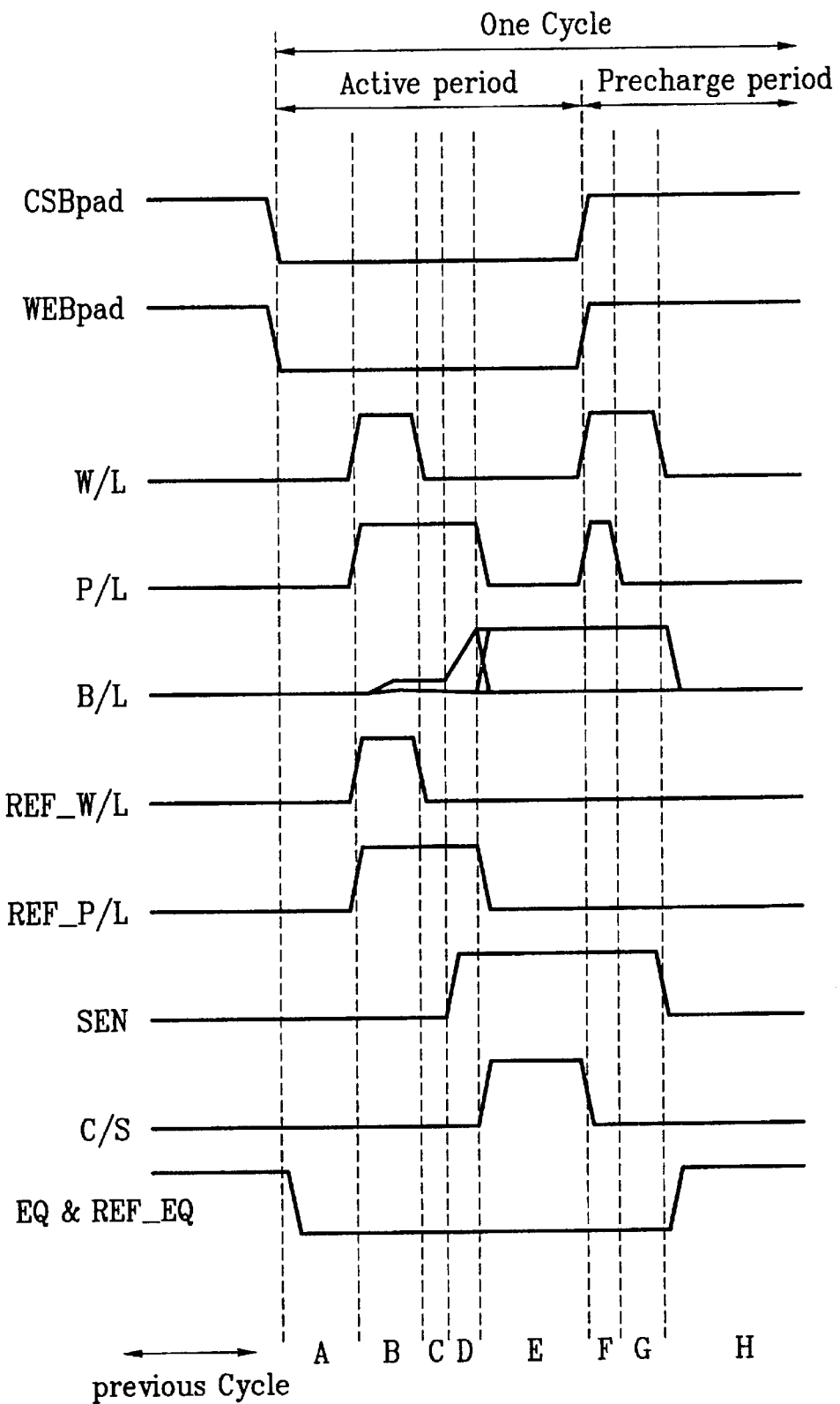
FIG. 10A is an exemplary timing chart showing the operation of a write mode according to the second embodiment of the present invention.

FIG. 10A is a timing chart showing the operation of a write mode according to the second embodiment of the present invention and FIG. 10B is a timing chart showing the operation of a read mode according to the second embodiment of the present invention.

As shown in FIGS. 10A and 10B, the method for driving the nonvolatile ferroelectric memory device according to the second embodiment of the present invention is similar to the method according to the first embodiment of the present invention; however, in the second embodiment of the present invention, the wordline and the plate line are activated to high levels twice in an active period of one cycle.

The plate line shows a first high level during the period where the wordline is at a first high level, and the plate line shows a second high level during an initial portion of the period during which the wordline is at the second high level.

In a period when the wordline and the plate line coincide at second high levels, the logic value "0" is written. In a period when the wordline at a second high level coincides with a plate line at a low level, the logic value "1" is restored or written.

In the method for driving the aforementioned nonvolatile ferroelectric memory device according to the second embodiment of the present invention, the reference plate line REF_P/L shows high level only when the plate line P/L shows a first high level.

Excluding the aforementioned description, the method for driving the aforementioned nonvolatile ferroelectric memory device according to the second embodiment of the present invention is substantially equal to the method according to the first embodiment of the present invention.

The method for driving a nonvolatile ferroelectric memory device according to the third embodiment of the present invention will now be explained.

Figure 11A:
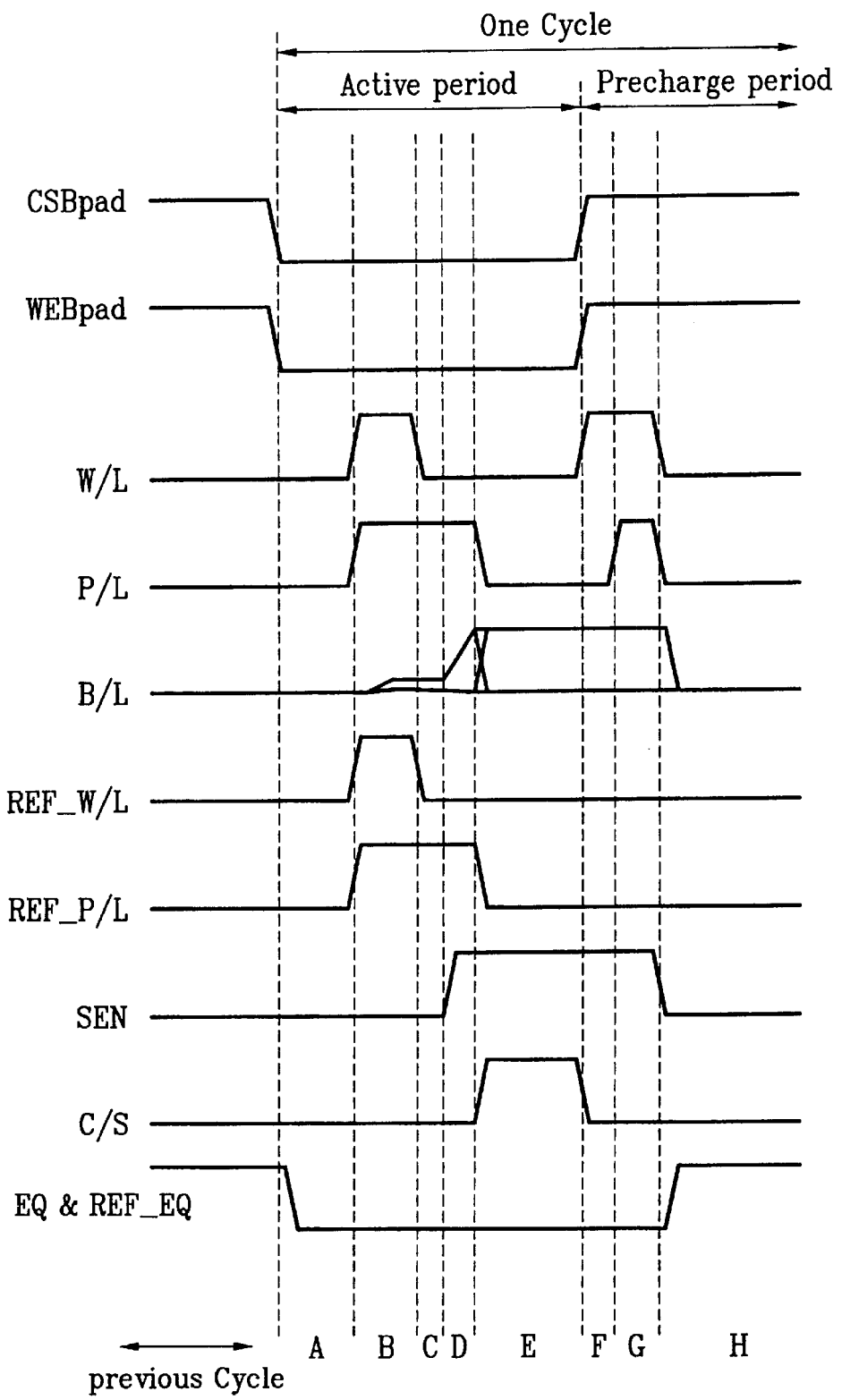
FIG. 11A is an exemplary timing chart showing the operation of a write mode according to the third embodiment of the present invention.
Figure 11B:
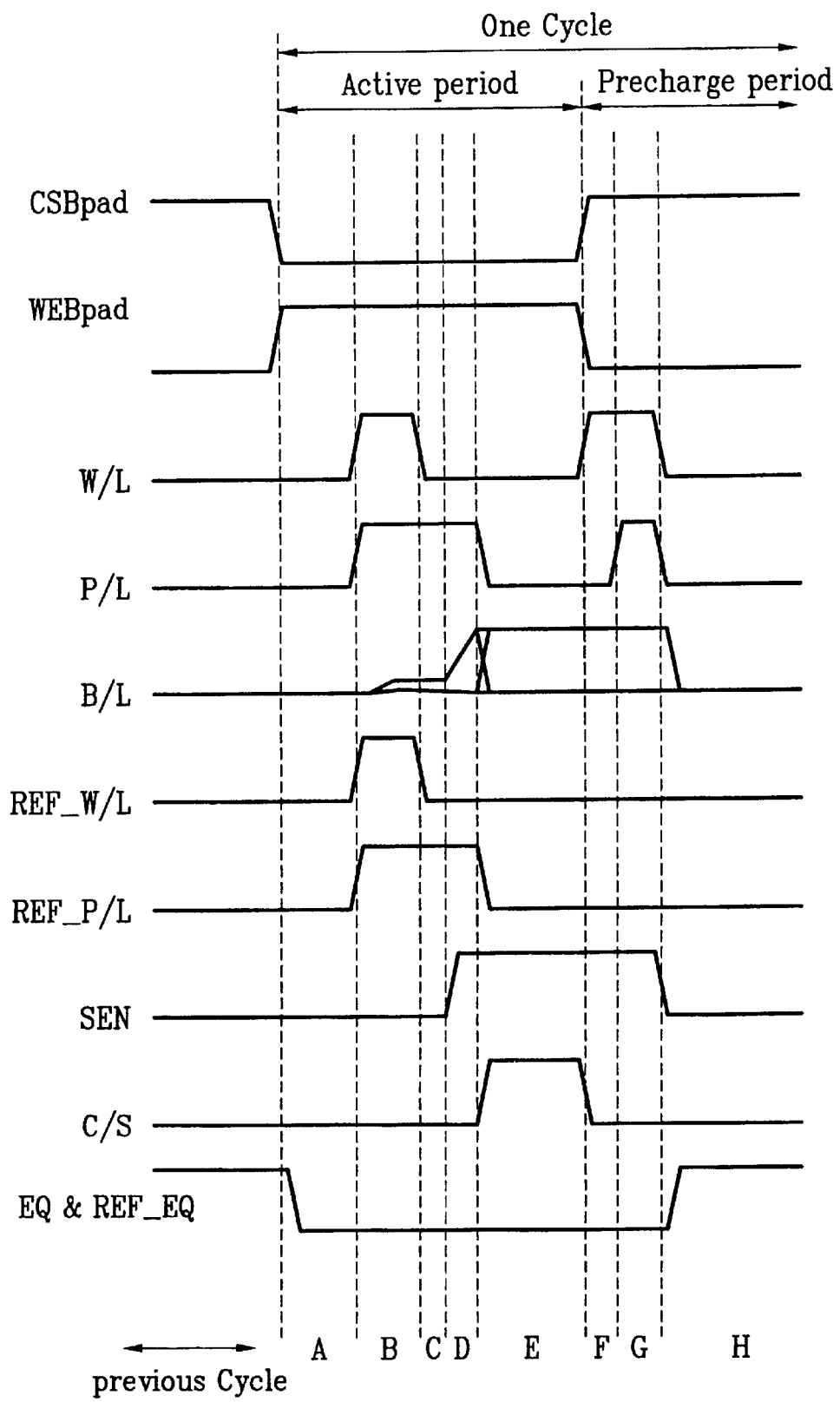
FIG. 11B is an exemplary timing chart showing the operation of a read mode according to the third embodiment of the present invention.

FIG. 11A is a timing chart showing the operation of a write mode according to the third embodiment of the present invention and FIG. 11B is a timing chart showing the operation of a read mode according to the third embodiment of the present invention.

As shown in FIGS. 11A and 11B, the method for driving the nonvolatile ferroelectric memory device according to the third embodiment of the present invention is almost equal to the method according to the second embodiment of the present invention.

In the third embodiment of the present invention, the wordline and the plate line are twice activated to high levels during an active period of one cycle, wherein the high level of the second plate line coincides only with a latter portion of the period when wordline is at the second high level.

Accordingly, in the period when the wordline is at the second high level and the second plate line is at a low level, the logic value "1" is restored or written, and in the period when both the word line and the plate line are in the second high level, the logic value "0" is written.

As described above, the nonvolatile ferroelectric memory device and method for driving the same according to the present invention has the following advantages.

First, when the wordlines are activated twice in the active period of one cycle, the level width of the first wordline is restricted. Thus, it is possible to restrict the quantity of charges generated in the cell, so that the data can uniformly be written or read in all the cell arrays without depending on the position.

Moreover, since the sensing amplifier is activated to high level after the first wordline is inactivated to low level, loading conditions of a resistor and a capacitor in the main bitline and the reference bitline in view of the sensing amplifier can equal to each other. Thus, the sensing voltage can be minimized. This reduces the size of the cell and reduces the size of the chip.

It will be apparent to those skilled in the art that various modifications and variations can be made in the method for driving nonvolatile ferroelectric memory device of the present invention without departing from the spirit and scope of the invention. Thus, it is intended that the present invention cover the modifications and variations of this invention provided they come within the scope of the appended claims and their equivalents.

What is claimed is:

1. A method for driving a nonvolatile ferroelectric memory device that includes a main cell provided with a transistor and a main cell wordline, a bitline, a first voltage applying line, and a reference cell provided with at least one transistor, a reference wordline and one or more ferroelectric capacitors, the method comprising the steps of:

primarily activating the main cell wordline and the reference wordline with respective high level signals in an active period of one cycle;

deactivating the main cell wordline and the reference wordline;

activating a sensing amplifier with a high level signal after the main cell wordline is inactivated;

secondarily activating the main cell wordline with a high level signal during a period in which the sensing amplifier is activated in the active period;

applying a high level signal at least one time or more to the first voltage applying line to be coincident with the secondary active period of the main cell wordline during at least one point of time; and transiting a chip enable signal from low to a high signal level to precharge the chip enable signal.

2. The method of claim 1, further comprising the step of activating a column selector in a period during which the sensing amplifier is activated.

3. The method of claim 1, wherein the reference cell further includes a second transistor for providing a reference voltage in response to a equalizer signal REF_EQ and the sensing amplifier includes a third transistor for equalizing levels on different portions of the bitline based on a bitline equalizer signal EQ, the method further comprising the step of deactivating the signals EQ and REF_EQ in the active period, during which the wordline is primarily and secondarily activated.

4. The method of claim 1, wherein the active period begins when a chip enable signal is transited to low level.

5. The method of claim 1, wherein the first voltage applying line is a reference plate line connected to the reference cell, and the reference plate line is activated to high level so as to at least partially coincide with the period in which the main cell wordline is primarily activated or the period in which the main cell wordline is secondarily activated.

6. The method of claim 1, further comprising the step of applying a write enable signal at a low level during the active period when the nonvolatile ferroelectric memory device is in write mode.

7. The method of claim 1, further comprising the step of applying a write enable signal at a high level during the active period when the nonvolatile ferroelectric memory device is in read mode.

8. The method of claim 1, wherein the reference wordline is only activated when the main cell wordline is primarily activated.

9. A method for driving a nonvolatile ferroelectric memory device that includes a plurality of sub cell arrays comprising a plurality of main cells and one or more reference cells, among which a reference cell of one of the sub cell arrays operates with a main cell of an adjacent sub cell array, each of the main cells and the reference cells including at least one transistor and one or more ferroelectric capacitors coupled to a bitline, each main cell including a main cell wordline and a plate line, and each reference cell including a reference wordline and a reference plate line, the method comprising the steps of:

primarily activating one of the main cell wordlines of a sub cell array, an adjacent reference wordline of an adjacent cell array, the corresponding plate line of the main cell, and the reference plate line of the corresponding reference cell to a high level;

deactivating the main cell wordline and the reference wordline;

precharging a chip enable signal by transiting the chip enable signal to high level;

activating a sensing amplifier after the main cell wordline is inactivated;

secondarily activating the main cell wordline to high level during the precharge period in a state that the sensing amplifier is activated; and activating the plate line to coincide with an initial portion of the period when the main cell wordline is secondarily activated to the high level.

10. The method of claim 9, further comprising the step of applying a write enable signal at a low level during the active period when the nonvolatile ferroelectric memory device is in write mode.

11. The method of claim 9, further comprising the step of applying a write enable signal at a high level during the active period when the nonvolatile ferroelectric memory device is in read mode.

12. The method of claim 9, wherein the reference plate line is activated until a period where the reference plate line coincides with an initial portion of the period when the main cell wordline is secondarily activated.

13. A method for driving a nonvolatile ferroelectric memory device that includes a plurality of sub cell arrays, each sub cell array comprising a plurality of main cells and one or more reference cells, among which a reference cell of one of the sub cell arrays operates with a main cell of an adjacent sub cell array, each main cell and each reference cell including at least one transistor and one or more ferroelectric capacitors coupled to a bitline, each main cell further including a main cell wordline and a plate line, and each reference cell including a reference wordline and a reference plate line, the method comprising the steps of:

primarily activating a main cell wordline of one of the sub cell arrays, a reference wordline of a sub cell array adjacent to the cell array including the activated main cell wordline, the plate line of the one of the sub cell arrays, and the reference plate line of the adjacent reference cell to high level;

deactivating the main cell wordline and the reference wordline;

activating a sensing amplifier after the main cell wordline is inactivated;

deactivating the plate line and the reference plate line after the main cell wordline is inactivated;

secondarily activating the main cell wordline to a high level;

precharging a chip enable signal by transiting the chip enable signal to high level; and secondarily activating the plate line to coincide with an initial portion of period during which the main cell wordline is secondarily activated.

14. A method for driving a nonvolatile ferroelectric memory device that includes a plurality of sub cell arrays, each sub cell array comprising a plurality of main cells and one or more reference cells, among which a reference cell of one of the sub cell arrays operates with a main cell of an adjacent sub cell array, each main cell and each reference cell including at least one transistor and one or more ferroelectric capacitors coupled to a bitline, each main cell further including a main cell wordline and a plate line, and each reference cell including a reference wordline and a reference plate line, the method comprising the steps of:

primarily activating a main cell wordline of one of the sub cell arrays, a reference wordline of a sub cell array adjacent to the cell array including the activated main cell wordline, the plate line of the one of the sub cell arrays, and the reference plate line of the adjacent reference cell to high level;

deactivating the main cell wordline and the reference wordline;

activating a sensing amplifier after the main cell wordline is inactivated;

deactivating the plate line and the reference plate line;

precharging a chip enable signal by transiting the chip enable signal to high level; and secondarily activating the plate line to coincide with a latter portion of the period during which the main cell wordline is secondarily activated.

* * * * *